United States Patent [19]

Itoh

[11] 4,112,508
[45] Sep. 5, 1978

[54] SEMICONDUCTOR MEMORY

[75] Inventor: Kiyoo Itoh, Higashikurume, Japan

[73] Assignee: Hitachi, Ltd., Japan

[21] Appl. No.: 831,138

[22] Filed: Sep. 7, 1977

[30] Foreign Application Priority Data

Sep. 10, 1976 [JP] Japan .................................. 51-107792

[51] Int. Cl.$^2$ ........................ G11C 11/40; G11C 13/00
[52] U.S. Cl. ..................................... 365/154; 365/203; 307/238
[58] Field of Search ................ 307/238, 221; 365/189, 365/203, 154

[56] References Cited

U.S. PATENT DOCUMENTS

3,950,737  4/1976  Uchida et al. ......................... 365/154

Primary Examiner—Terrell W. Fears
Attorney, Agent, or Firm—Craig & Antonelli

[57] ABSTRACT

A semiconductor memory comprises means for forcing the potential on one data line to which no writing means is connected to be set to a certain level after data have been read from a memory cell, and means for setting the level of the one data line cooperating with another data line supplied with a voltage corresponding to data to be written and a sense amplifier in order to restore the one data line set to the certain level to the voltage corresponding to the data to be written. This allows the inversion of the sense amplifier due to an external writing signal without any influence from the resistive component of the data line.

25 Claims, 16 Drawing Figures

TIME

SEMICONDUCTOR MEMORY

LIST OF PRIOR ART REFERENCES (37 CFR 1.56 (a))

The following reference is cited to show the state of art:
Institute of Electrical and Electronics Engineers Journal of Solid-State Circuits, vol. SC-8, No. 5, Oct. 1973, pp. 319 – 323 and pp. 310 – 318

BACKGROUND OF THE INVENTION

The present invention relates to a memory, and more particularly to an improvement of a large scale integration semiconductor memory in which data can be written in place externally into a predetermined memory cell even when fine data lines are used.

A MOS (Metal Oxide Semiconductor) transistor memory has recently been studied and developed for a great capacity and high speed memory for electric computers. Such a memory are disclosed, for example, in the literature, "Institute of Electrical and Electronics Engineers Journal of Solid-State Circuits", Vol. SC-8, No. 5, Oct. 1973, pp. 319 to 323 or pp. 310 to 318.

Such a conventional memory includes a flip-flop sense amplifier connected on both sides to a pair of data lines, to each of which a plurality of memory cells are connected. Such a memory has a plurality of combinations each comprising such a sense amplifier, a pair of data lines and memory cells with those data lines connected at right angles to word lines for selecting any one of the memory cells.

The writing of data into these memory cells on reading of data therefrom is carried out by writing or reading means which is connected in common to all the memory cells.

The forming of the data lines by a fine pattern in an attempt to achieve a large scale integration increases their wiring resistance. It has been found that the large wiring resistance in the conventional memory is so disadvantageous that data cannot be externally written in place.

SUMMARY OF THE INVENTION

An object of the present invention is to provide a memory free from the above-mentioned drawback in the prior art, i.e., a memory capable of storing data externally into a memory cell in place even in a large scale integration circuit, and more particularly to provide a memory capable of inversing the sense amplifier by means of an external writing signal without any dependence upon the resistance of data lines.

A memory according to the present invention comprises means for forcing the potential level on one data line to which no writing means is connected to be set to a certain level after data have been read from a memory cell, and means for setting the level of the one data line cooperating with another data line supplied with a voltage corresponding to data to be written and a sense amplifier in order to restore the data line set to the certain level to the voltage corresponding to the data to be written.

BRIEF DESCRIPTION OF THE DRAWINGS

The arrangement and features of the present invention will be understood by the description of its embodiments in conjunction with the drawings in which:

FIGS. 7(a) and (b) are another arrangement of a memory according to the present invention, and a time chart of essential signals in the memory respectively;

DESCRIPTION OF THE PREFERRED EMBODIMENTS

For the purpose of improving the understanding of the present invention, the arrangement and operation of a conventional memory will be described from the view point of making its drawback clear.

Figure 1:
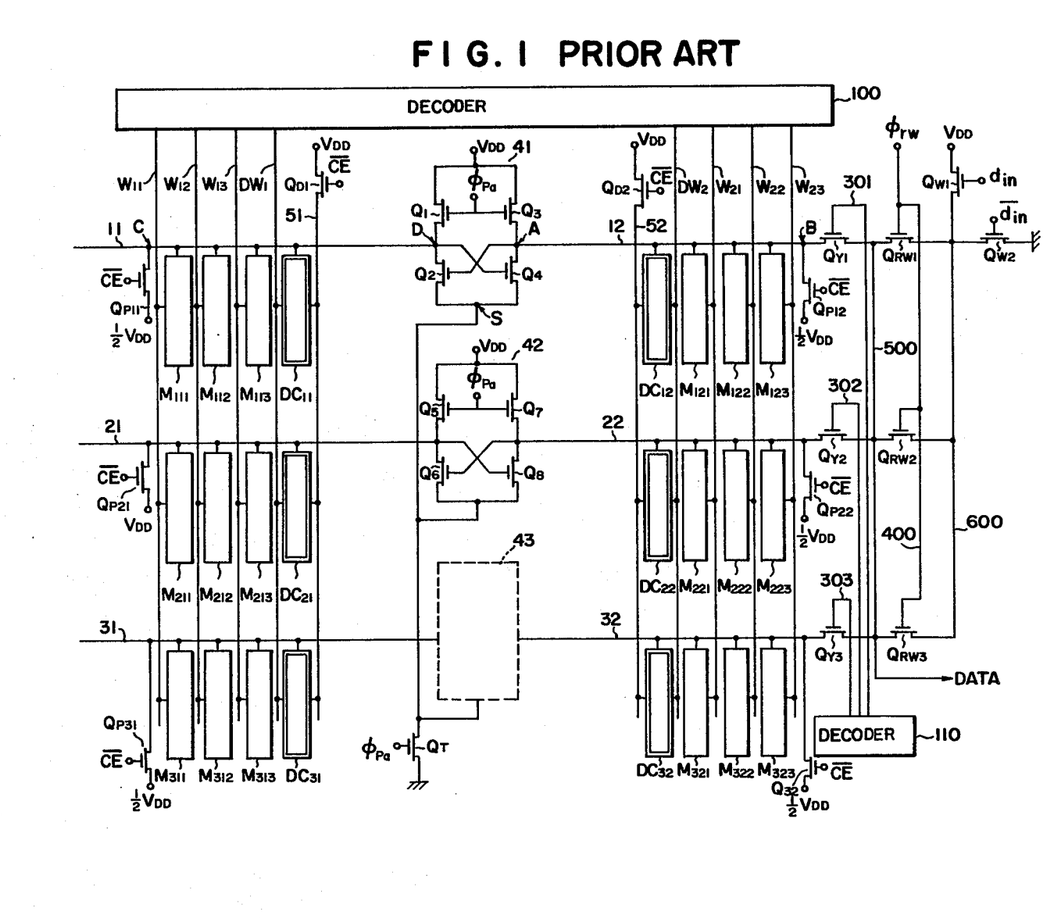
FIG. 1 is an arrangement showing a conventional memory.

FIG. 1 shows an arrangement of a conventional memory, in which it is assumed that all transistors are N-type field effect transistors. The memory includes data lines 11, 12, 21, 22, 31, 32, to each of which memory cells $M_{111}$, $M_{112}$, $M_{113}$; $M_{121}$, $M_{122}$, $M_{123}$; $M_{211}$, $M_{212}$, $M_{213}$; $M_{221}$, $M_{222}$, $M_{223}$; $M_{312}$, $M_{313}$; $M_{321}$, $M_{322}$, $M_{323}$ and dummy cells $DC_{11}$, $DC_{12}$, $DC_{21}$, $DC_{22}$, $DC_{31}$, $DC_{32}$ are connected, respectively. Each memory cell is connected to any one of word lines $W_{11}$, $W_{12}$, $W_{13}$, $W_{21}$, $W_{22}$, $W_{23}$. Each dummy cell is, on the other hand, connected to either one of dummy word lines $DW_1$, $DW_2$ and further to either one of dummy writing lines 51, 52. A decoder 100 serves to turn these word lines and dummy word lines to a high potential level in a selective manner. The selection of the word lines and dummy word lines to the high potential level is determined by input signals (not shown) to the decoder. It is of course that, instead of the decoder 100 common to all the data lines, decoders may be provided each of which corresponds to each of the data lines 12, 22, 32 and receives input signals separately.

Switching transistors $QY_1$, $QY_2$, $QY_3$ serve to select only one of the data lines 12, 22, 32 and connect the selected data line to an output line 500. Each of the transistors is selectively made conductive only when the corresponding lines 301, 302, 303 are at the high level. The selection which lines 301, 302, 303 should be made to the high level is determined depending upon an input signal (not shown) to a decoder 110. A signal of high on low level on the line 500 is used as DATA. Transistors $Q_{RW1}$, $Q_{RW2}$, $Q_{RW3}$ are simultaneously made conductive by a signal $\phi_{rw}$ when data are desired to be written into any of the memory cells. In reading the data from the memory cells the signal $\phi_{rw}$ is at a low level with all the transistors $Q_{RW1}$, $Q_{RW2}$, $Q_{RW3}$ all in an off-state. The data to be written into the memory cell through the transistors $Q_{RW1}$, $Q_{RW2}$, $Q_{RW3}$ are transmitted by making either one of transistors $Q_{W1}$, $Q_{W2}$ conductive. The transistors $Q_{W1}$, $Q_{W2}$ have their drain held at a high voltage $V_{DD}$ volt and a low voltage 0 volt, respectively. For information "1" to be written, a signal din is made, for example, at the high voltage while a signal $\overline{din}$ at the low voltage, and vice versa for information "0" to be written.

Transistors $Q_{P11}$, $Q_{P12}$, $Q_{P21}$, $Q_{P22}$, $Q_{P31}$, $Q_{P32}$ operate to precharge the data lines 11, 12, 21, 22, 31, 32 connected thereto to an intermediate potential level $\frac{1}{2} V_{DD}$, respectively. These transistors have their gate supplied with a precharge signal $\overline{CE}$. Transistors $Q_{D1}$, $Q_{D2}$ have their gate supplied with the same signal $\overline{CE}$ as the precharge signal and serve to provide a high potential level ($V_{DD}$) to the dummy writing lines 51, 52.

Sense amplifiers 41, 42, 43 comprise a flip-flop of transistors $Q_1$ to $Q_4$ and $Q_5$ to $Q_8$ (the flip-flop corresponding to 43 is shown). The flip-flop 41 is a parallel circuit consisting of the transistors $Q_1$ and $Q_2$ connected in series and the transistors $Q_3$ and $Q_4$ connected in series in which the gates of the transistors $Q_1$ and $Q_3$ are connected to each other, the sources of the transistors $Q_1$ and $Q_3$ are connected to the data lines 11 and 12, respectively, the drains of the transistors $Q_1$ and $Q_3$ are connected to each other, the drain of the transistor $Q_2$ and the gate of the transistor $Q_4$ are connected to the data line 11, the gate of the transistor $Q_2$ and the drain of the transistor $Q_4$ are connected to the data line 12, and the sources of the transistors $Q_2$ and $Q_4$ are connected to each other. The flip-flops 42 and 43 are constructed in the same way as in the flip-flop 41. These flip-flops 41, 42, 43 function to amplify the small difference of potentials on a pair of data line 11, 12; 21, 22; and 31, 32. A signal $\phi_{pa}$ to be applied to the respective gates of the transistors $Q_1$ and $Q_3$ serves to make the flip-flop active. The signal $\phi_{pa}$ of a high potential level causes the transistors $Q_T$ connected to the respective sources of the transistor $Q_2$ and $Q_4$, $Q_1$, $Q_3$ to be conductive to apply the high level ($V_{DD}$) through the respective drains of the transistors $Q_1$ and $Q_3$ and ground level to the flip-flop.

Figure 2:
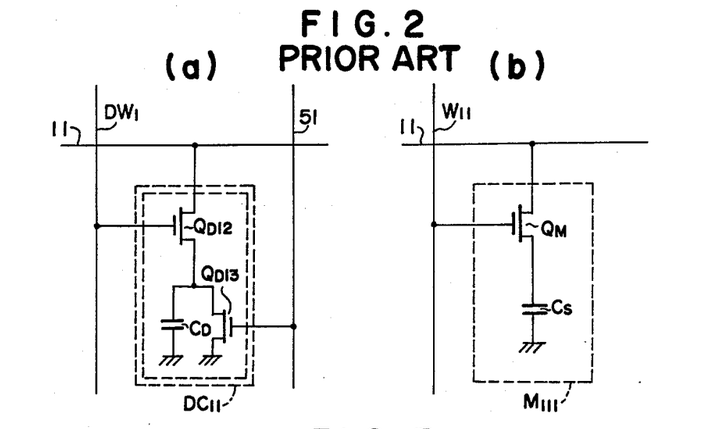
FIG. 2 is an arrangement showing a memory cell and a dummy cell which are used in the conventional memory.

FIG. 2 shows a specified example of the structure of the above-mentioned memory cell and dummy cell in the conventional memory and the connection of the data and word lines therewith. FIG. 2(a) shows the structure of the memory cell $M_{111}$ and the connection of the data line 11 and the word line $W_{11}$ to the memory cell $M_{111}$. The memory cell $M_{111}$ comprises an information storing capacitor $C_S$ and a transistor $Q_M$ which has its gate connected to the word line $W_{11}$, its source to the data line 11 and its drain to the information storing capacitor $C_S$.

FIG. 2(b) shows the structure of the dummy cell $DC_{11}$ and the connection of the dummy cell $DC_{11}$ to the data line 11, dummy word line DW and dummy writing line 51. The dummy cell $DC_{11}$ comprises a dummy information storing capacitor $C_D$, a transistor $Q_{D12}$ which has its gate connected to the word line $DW_1$, its source to the data line 11 and its drain to the dummy information storing capacitor $C_D$, and a transistor $Q_{D13}$ which has its source connected to the capacitor $C_D$, its drain to the ground level and its gate to the dummy writing line 51. The capacity of the capacitor $C_D$ is selected to be sufficiently small, about one-tenth as great as that of the capacitor $C_S$. The dummy cell also has the same structure as that shown in FIGS. 2(a), (b).

Figure 3:
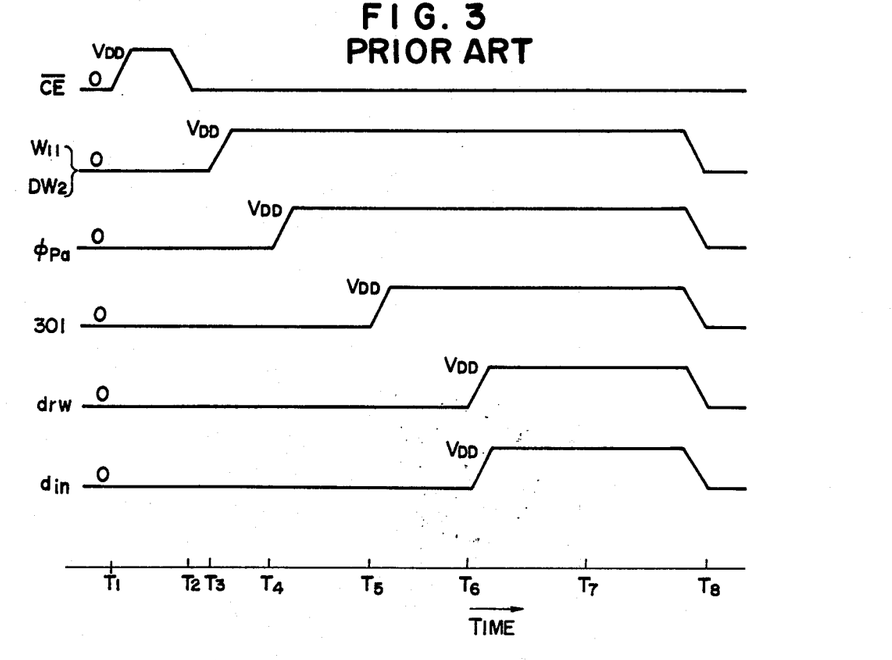
FIG. 3 is a time chart showing essential control signals used in the conventional memory.

FIG. 3 shows a time chart of essential control signals generated when data "1" are to be written externally into the memory cell $M_{111}$.

In order to externally write data into the predetermined memory cell, the reading of data in all the memory cells connected to the selected word line are once be effected.

The reading of data in the memory as shown in FIG. 1 is effected as follows:

The precharge signal $\overline{CE}$ is made to the high potential level $V_{DD}$ at a time $T_1$ to turn on all the transistors $Q_{P11}$, $Q_{P12}$, $Q_{P21}$, $Q_{P22}$, $Q_{P31}$, $Q_{P32}$. This causes all the data lines to be charged to the intermediate level $\frac{1}{2} V_{DD}$. The precharge signal is also simultaneously applied to each gate of the transistors $Q_{D1}$, $Q_{D2}$ with the result that the dummy writing lines 51, 52 are all charged to a high level substantially equal to $V_{DD}$. This causes the transistor $Q_{D13}$ (in FIG. 2(b)) in the dummy cell to be turned on and the dummy information storing capacitor $C_D$ to be set to the zero level. Thus, the dummy information storing capacitor $C_D$ in all the other dummy cells is set to the zero level. After the above precharging operations, the signal $\overline{CE}$ is turned to the zero level at a time $T_2$.

At a time $T_3$ a word line (for example, line $W_{11}$) connected by the decoder 100 to a specified memory cell (for example, cell $M_{111}$) to be read is changed in potential from the low (0 volt) to high ($V_{DD}$). At the same time, a dummy word line (for example, $DW_2$) opposite to the word line (for example, $W_{11}$) with respect to flip-flop 41 to 43 as is also changed from the low level (0 volt) to high level ($V_{DD}$). At a time $T_4$ the signal $\phi_{pa}$ is then turned from the low (0 volt) to high level ($V_{DD}$) to make the sense amplifiers 41 to 43 active with the result that the data line 11 is higher in potential than $\frac{1}{2} V_{DD}$ when the voltage across the information storing capacitor $C_S$ in the memory cell $M_{111}$ is at the high level and the data line 11 is lower in potential than $\frac{1}{2} V_{DD}$ when the voltage across the information storing capacitor $C_S$ is at the low level. The data lines 21, 31 also take a level different from $\frac{1}{2} V_{DD}$ depending upon the contents of the memory cells $M_{211}$ and $M_{311}$, respectively. The data lines 12, 22, 32 to be detected in a differential manner with respect to the data lines 11, 21, 31 remain at the original precharge level $\frac{1}{2} V_{DD}$ without any substantial change because of the very small capacitance of the dummy information storing capacitor $C_D$.

Thus, the levels of the data line after the reading are $\frac{1}{2} V_{DD}$ for the reading of the dummy cell, and higher or lower than $\frac{1}{2} V_{DD}$ for the reading of the memory cell. This difference of the levels is amplified by the sense amplifiers 41 to 43. The one of a pair of data lines connected to each sense amplifier is raised to a higher level, ultimately to a level substantially equal to $V_{DD}$ if it is at the higher level, and reduced to a lower level, ultimately to the zero lelvel if it is at the lower level.

Thus, the data lines 12, 22, 32 are set to the level of $V_{DD}$ or 0 according to the low on high voltage stored in the memory cells $M_{111}$, $M_{211}$, $M_{311}$. Thus, the reading step in writing operation ends.

When the memory cell $M_{111}$ is to be written, only the line 301 is turned to the high level at a time $T_5$ by the signal from the decoder 110 after the above-mentioned reading step in order to turn only the transistor $Q_{T1}$ on and the other transistors $Q_{T2}$, $Q_{T3}$ off.

Further, the signal din or $\overline{din}$ is turned to the high level at a time $T_6$ according to whether the data to be written is "1" or "0" with the word line $W_{11}$, dummy word line $DW_2$ and line 301 held at the high level. This causes the transistor $Q_{W1}$ or $Q_{W2}$ to be turned on and the line 600 to be at the level $V_{DD}$ or 0 volt depending upon the data to be written. With the above operation, the writing signal $\phi_{rw}$ is changed to the high level at the time $T_6$ to turn all the transistors $Q_{RW1}$, $Q_{RW2}$, $Q_{RW3}$ off. Thus, when the potential of the data line 12 is different from that prior to the application of the signal $\phi_{rw}$, the flip-flop 41 is inverted with the potential of the data line 11 different from that prior to the application of the signal $\phi_{rw}$ with the result that the given data are written into the memory cell $M_{111}$.

For data "1" (low voltage) to be written, the signal din is made to the high level and the signal $\overline{din}$ to the low level with the data line 12 set to the high level. At this time, the function of the flip-flop 41 causes the data line 11 to be set to the low level. This leads to the storing of "1" (low voltage) in the memory cell with the aid of the functions of the word line $W_{11}$ and data line 11. For data "0" (high voltage) to be written, a potential relation quite opposite to that as mentioned above is established with the high voltage written in the memory cell $M_{111}$. The other memory cells $M_{211}$, $M_{311}$ are not influenced by the external writing operation because of the turnedoff transistors $Q_{Y2}$, $Q_{Y3}$, and thus store the original read data.

As mentioned above, the memory cells on the data lines 11, 21, 31 store the low or high voltage depending upon the information "1" or "0" which is to be written.

When the data are intended to be read from the memory cells, it is effected by dropping the signal 301 on the way in the above writing operation at a time $T_6$ to a low level without applying signals $\phi_{rw}$ and din.

As a result, the line 500 is substantially at the same potential level as the data line 12 with its potential derived there from as DATA.

Then, the voltage which has been read out externally is a voltage stored in the memory cell $M_{111}$ with its level inversed. This appears to be objectionable, but actually causes no problem because the memory cell $M_{111}$ originally stores the inversed voltage.

The above description has been made about the reading of information from or writing to the memory cell $M_{111}$, but it will be understood that the reading of information from the memory cells on the data lines 12, 22, 32 can be carried out quite similarly, only differing from the reading from the memory cells on the data lines 11, 21, 31 in that the memory cells on the data lines 12, 22, 32 store the high or low voltage depending upon the information "1" or "0" to be written into the memory cells and the stored information is read out in the form of the high or low voltage without any inversion.

Thus, it has been appreciated that the conventional memory has the function of reading the information from any memory cell or externally writing it therein. A problem, however, arises that data are written externally with difficulties for the conventional memory which is integrated in a large scale.

This drawback will be described, for example, in conjunction with the writing of the memory cell $M_{111}$. Assume that the memory cell $M_{111}$ is charged with a voltage of high level ($V_{DD}$) or logic "0". The previously described writing operation of the memory cell $M_{111}$ causes the data line 11 to reach a high level (substantially equal to $V_{DD}$ volt) and the data line 12 to reach a low level (substantially equal to 0 volt) by the function of the flip-flop 41. When, at this time, the logic "1" or data (with the low voltage) is to be written externally into the memory cell $M_{111}$, the signal din is turned to the high level and the signal $\overline{din}$ to the low level with the simultaneous turning of the signal $\phi_{rw}$ to the high level to turn the transistor $Q_{RW1}$ on. After this operation, the transistor $Q_4$ is in the on-state because the data line 11 is at the high level. This allows a current to flow from a power supply ($V_{DD}$ volt) through the transistors $Q_{W1}$, $Q_{RW1}$, $Q_{Y1}$ along the data line 12 to the transistors $Q_4$, $Q_T$. A large wiring resistance between both ends A, B on the data line 12 causes a voltage drop across the ends A, B of data line 12 with the result that a potential difference between the point A and an intermediate point S of the flip-flop is smaller than a level required to make the transistor $Q_2$ conductive. For this reason, the flip-flop 41 is not inverted with the data line 11 remaining at the high level although the point B has been turned to the high level. This means that the logic "1" (low voltage) cannot be written into the memory cell $M_{111}$.

As mentioned above, the conventional memory has no ability to effect the external writing operation for the data line of large wiring resistance. This is disadvantageous particularly for the large scale integration because in this case the data line must be small in width with the result of the great wiring resistance of the data line.

In the following, the present invention will be described by way of embodiments.

Figure 4:
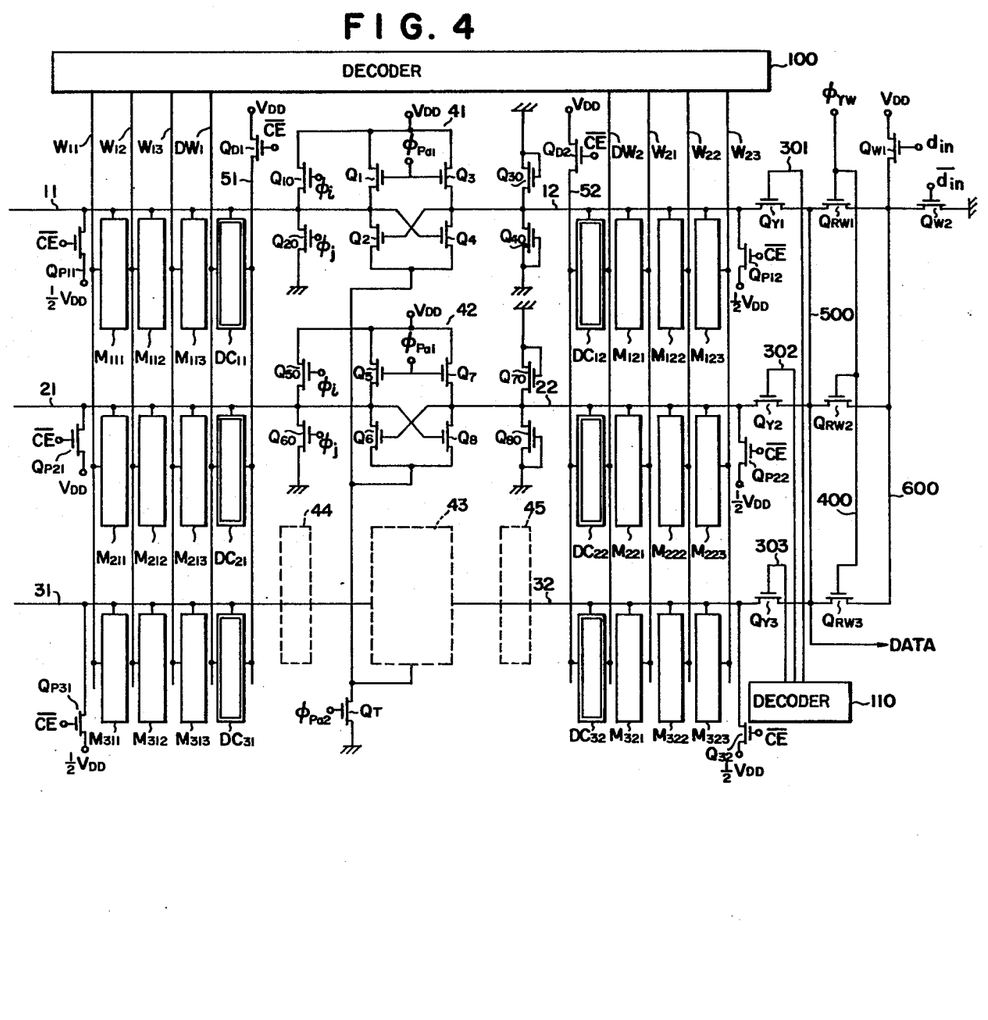
FIG. 4 is an arrangement of a memory according to the present invention.
Figure 5:
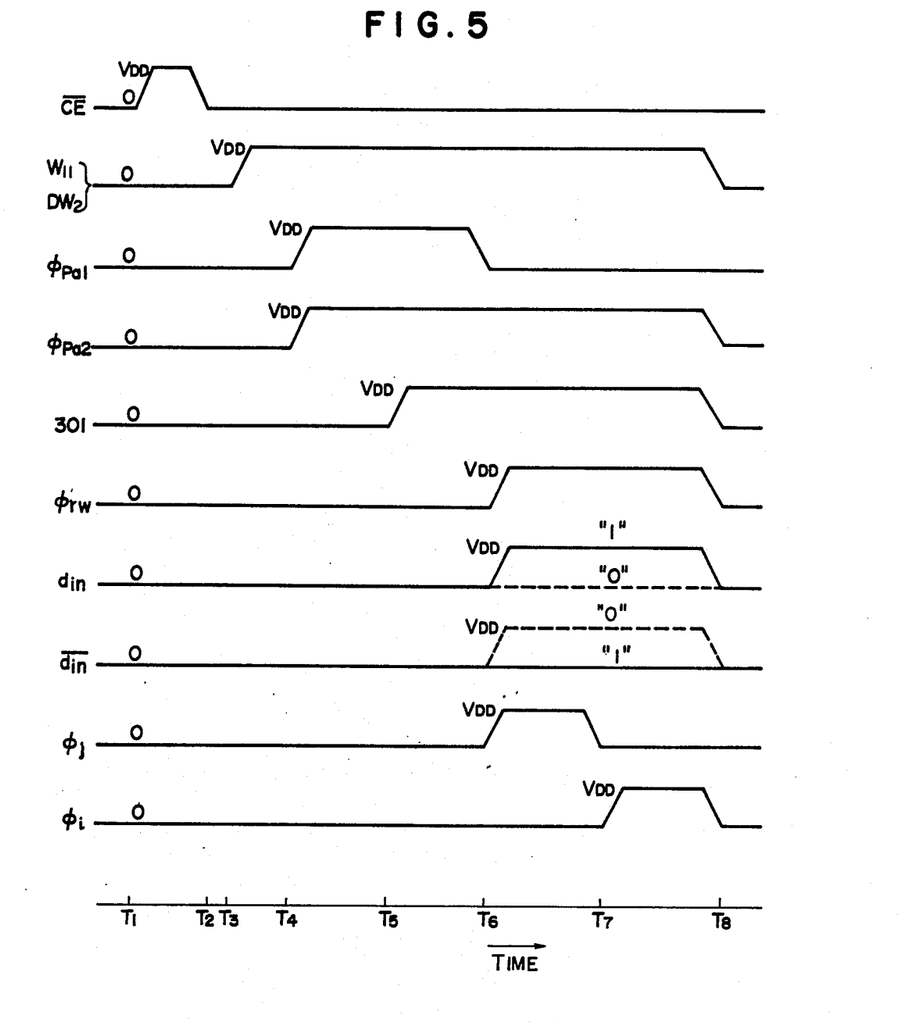
FIG. 5 is a time chart showing essential control signals used in the memory according to the present invention.

FIG. 4 shows one embodiment of the present invention and FIG. 5 shows waveforms of essential control signals used in the memory of FIG. 4.

The memory in FIG. 4 differs from that in FIG. 1 in that transistors $Q_{10}$, $Q_{20}$ connected in series, $Q_{30}$, $Q_{40}$ connected in series; $Q_{50}$, $Q_{60}$ connected in series, $Q_{70}$, $Q_{80}$ connected in series; are provided and the transistors $Q_{10}$, $Q_{20}$, $Q_{50}$, $Q_{60}$ are controlled for conduction by signals $\phi_{\bar{p}}$, $\phi_p$, and that a signal $\phi_{pa1}$ for controlling the conduction of the transistors $Q_1$, $Q_3$; $Q_5$, $Q_7$ of the flip-flops 41, 42 is provided separately from a signal $\phi_{pa2}$ for controlling the conduction of the transistor $Q_T$.

The source of the transistor $Q_{10}$ and the drain of the transistor $Q_{20}$ are connected to the data line 11 and the drain of the transistor $Q_{10}$ is connected to the drains of the transistors $Q_1$ and $Q_3$.

The source of the transistor $Q_{30}$ and the drain of the transistor $Q_{40}$ are connected to the data line 12, and the gates of the transistors $Q_{30}$ and $Q_{40}$ are grounded. The transistors $Q_{50}$, $Q_{60}$, $Q_{70}$ and $Q_{80}$ are connected in the same manner as in the transistors $Q_{10}$, $Q_{20}$, $Q_{30}$, $Q_{40}$.

Blocks 44, 45 in FIG. 4 schematically show the same circuits as the circuit composed of the transistors $Q_{10}$, $Q_{20}$ and the circuit composed of the transistors $Q_{30}$, $Q_{40}$ respectively connected to the data lines 11, 12. The transistors $Q_{20}$, $Q_{60}$ serve to force the data lines 11, 21 to be set to the low level. The transistors $Q_{10}$, $Q_{50}$ serve to set the data lines 11, 21 forced to be set to the low level to a level opposite to that of the data lines 12, 22 in cooperation with the transistors $Q_2$, $Q_6$, $Q_T$. The transistors $Q_{30}$, $Q_{40}$, $Q_{70}$, $Q_{80}$ are provided to eliminate that unbalance of load capacitances between the data lines 11, 12, and the data lines 21, 22 which is generated by connecting the transistors $Q_{10}$, $Q_{20}$, $Q_{50}$, $Q_{60}$ to the data lines 11, 21, respectively. It is, therefore, preferable that the transistors $Q_{30}$, $Q_{40}$, $Q_{70}$, $Q_{80}$ are quite the same in structure as the transistors $Q_{10}$, $Q_{20}$, $Q_{50}$, $Q_{60}$. The input capacity of the transistors $Q_{10}$, $Q_{20}$ as viewed from the data line 11 is set to be the same as that of the transistors $Q_{30}$, $Q_{40}$ as viewed from the data line 12. It is of course that the transistors $Q_{30}$, $Q_{40}$, $Q_{70}$, $Q_{80}$ can be removed when a small unbalance takes place between the data lines 11, 12 and 21, 22 in the connection of the transistors $Q_{10}$, $Q_{20}$, $Q_{50}$, $Q_{60}$ with the data lines 11, 21, or when another means is used which can eliminate the unbalance. It is further assumed that the transistors $Q_{10}$, $Q_{50}$ have their conductance $g_m$ which is smaller than the respective conductances $g_m$'s of the transistors $Q_2$, $Q_6$ and $Q_T$.

Both the control signals $\phi_{pa1}$, $\phi_{pa2}$ function to make the flip-flops 41, 42, 43 active after the selected word lines have been turned to the high level. The signal $\phi_{pa1}$ is turned to the low level after the reading of data from the memory cells. The signal $\phi_j$ serves to turn the transistors $Q_{20}$ and $Q_{60}$ on and hold the data lines 11, 21 and the like at the low level prior to the external writing operation of data. There is no special limitation between the timing of the signal $\phi_j$ and the timing of the writing signal $\phi_{rw}$ at the high level, but the signal $\phi_j$ must be at the high level at least before the signal $\phi_i$ to be described later reaches the high level. The signal $\phi_i$ serves to provide the transistors $Q_{10}$ and $Q_{50}$ with a function of setting the level of the data lines 11, 21 and the like forced to be turned to the low level by the transistors $Q_{20}$, $Q_{60}$ and the signal $\phi_j$ to a level corresponding to the writing data "1" or "0" in cooperation with the transistors $Q_2$, $Q_6$.

The operation of the memory in FIG. 4 will be described with reference to control signals in FIG. 5 with an example in which data are again written into the memory cell $M_{111}$ on the basis of external signals after the data have been read out of the memory cell $M_{111}$. It is to be noted that no following description will be made with respect to the data lines 31, 32 because the description on the operation of the data lines 21, 22 makes possible the easy understanding thereof.

In the reading of the memory cells, all the data lines are precharged to the intermediate level $\frac{1}{2} V_{DD}$ at a time $T_1$ with the aid of the signal $\overline{CE}$, which also turns the transistors $Q_{D1}$, $Q_{D2}$ on to make a charge across the dummy information storing capacitor $C_D$ in all the dummy cells to zero. At a time $T_2$, the signal $\overline{CE}$ is turned to the zero potential. After that, the potentials of the word line $W_{11}$ and the dummy word line $DW_2$ are turned from 0 volt to a high level ($V_{DD}$ volt) at a time $T_3$ to transmit the contents of the memory cells $M_{111}$, $M_{211}$, $M_{311}$ connected to the word line $W_{11}$ to the data lines 11, 21, 31, respectively. The contents in the dummy cells $DC_{12}$, $DC_{22}$, $DC_{32}$ are similarly processed.

In order to make the flip-flop 41 active, the signals $\phi_{pa1}$, $\phi_{pa2}$ are next turned to the high level at a time $T_4$ with the result that the data line 11 reaches either low (0 volt) or high level by the function of the flip-flop 41. In this state, the line 301 is changed from the low to high level by the decoder 110 at a time $T_5$ to make only the transistor $Q_{y1}$ conductive that corresponds to the memory cell $M_{111}$ to be written. During the above operation the signals $\phi_i$, $\phi_j$ are all held at the low level. It is, therefore, understood that the above-mentioned operation is quite the same as that of the conventional memory in FIG. 1. The memory according to the present invention, however, differs from the memory in FIG. 1 in the following operations.

After the reading operation the signal $\phi_{pa1}$ is turned from the high level back to the low level at a time $T_6$. At the same time, the signal din or $\overline{din}$ is changed to the high level depending upon the data "1" or "0" which are to be written. The signal $\phi_j$ is further turned to the high level at this time with the signal $\phi_i$ held at the low level. After that, only the signal $\phi_j$ is changed from the high to low level at a time $T_7$ with the signal $\phi_i$ changed from the low to high level, and all the signals at the high level are then turned to the low level after a predetermined time has elapsed. One cycle of the writing of data into the memory cells ends with the above operations. In the following, the operation of writing external data into the memory cell $M_{111}$ will be described more fully.

(1) For data "1" in the memory cell $M_{111}$ and external writing data "1".

Figure 6:
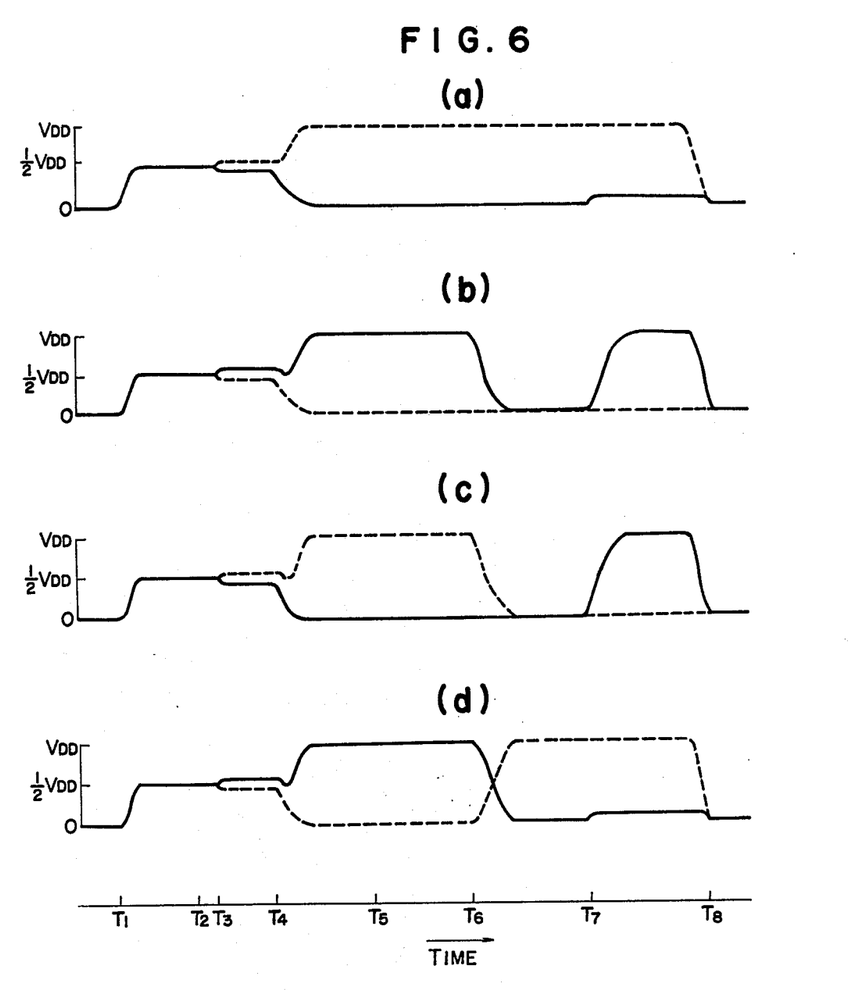
FIGS. 6(a) – (d) is a view showing potential transitions on data lines in the memory according to the present invention.

The data line 11 is at the low level and the data line 12 at the high level after the reading of the data from the memory cell $M_{111}$. In this state, the signal din is turned to the high level and the signal $\overline{din}$ to the low level at the time $T_6$ in order to write "1" (low voltage) into the memory cell $M_{111}$. At this time, therefore, the data line 12 is held at the high level in potential without any change with the transistor $Q_2$ held in the on-state. The potential of the data line 11, on the other hand, remains unchanged even if the signal $\phi_j$ is changed to the high level at the time $T_6$. Thus, the above operation causes no inversion of the flip-flop 41 with the transistor $Q_2$ on and the transistor $Q_4$ off. Assume that, in this state, the signal $\phi_j$ is changed to the low level and the signal $\phi_i$ to the high level. This causes the transistor $Q_{10}$ to be turned on and a current to flow from the transistor $Q_{10}$ along the transistor $Q_2$ which remains turned on. Thus, the level on the data line 11 takes a level determined by a ratio of conductances $g_m$ of the transistors $Q_{10}$ to $Q_2$, $Q_T$. According to the present invention, the potential of the data line 11 can be held at a sufficiently low level if the conductance $g_m$ of the transistor $Q_{10}$ is made much smaller than those of the transistors $Q_2$, $Q_T$. At this time, the data line 12 remains held at the high level because the transistor $Q_4$ is off. Thus, the levels of the data lines 11, 12 can be set to the low and high levels depending upon the data "1" to be written, respectively. At this time, the data "1" (low level) can be written into the memory cell $M_{111}$ because the word line $W_{11}$ is held at the high level. The level transition on the data lines 11, 12 in the above description of the operations is such as shown in FIG. 6(a), in which a solid line corresponds to the data line 11 and a dotted line to the data line 12 with the abscissa showing a time axis as in FIG. 5.

(2) For data "0" in the memory cell $M_{111}$ and external writing data "0"

The data line 11 is at the high level and the data line 12 at the low level after the reading of the data from the memory cell $M_{111}$. In this state, the signal din is turned to the low level and the signal $\overline{din}$ to the high level at the time $T_6$ in order to write "0" (high voltage) into the memory cell $M_{111}$. At this time, therefore, the data line 12 is held at the low level without any change with the transistor $Q_2$ held in the off-state. The data line 11 is, on the other hand, forced to be set to the low level because the transistor $Q_{20}$ is turned on if the signal $\overline{din}$ is changed to the high level and the signal $\phi_j$ to the high level simultaneously. This causes the transistor $Q_4$ to be also turned off. At the time $T_7$, the signal $\phi_j$ is then turned to the low level and the signal $\phi_i$ to the high level with the result that the transistor $Q_{20}$ is turned off and the transistor $Q_{10}$ is turned on. Consequently, the data line 11 is raised to the high level because the transistor $Q_2$ is off. This causes the transistor $Q_4$ to be turned on and the data line 12 to be held at the low level without any change. Thus, the levels of the data lines 11, 12 can be set to the high and low levels depending upon the data "0" to be written, respectively. The level transition on the data lines 11, 12 in the above operation is such as shown in FIG. 6(b), in which solid and dotted lines correspond to the data lines 11, 12, respectively, with its abscissa showing a time axis as in FIG. 5.

(3) For data "1" in the memory cell $M_{111}$ and external writing data "0"

The data line 11 is at the low level and the data line 12 at the high level after the reading of the data from the memory cell $M_{111}$. In this state, the signal $\overline{din}$ is turned to the high level and the signal din to the low level at the time $T_6$ in order to write "0" (high voltage) into the memory cell $M_{111}$. At this time, the data line 12 is held at the low level. The data line 11 is, on the other hand, forced to be set to the low level by turning the signal $\phi_j$ to the high level. At this time, therefore, both the transistors $Q_2$, $Q_4$ are off because the data lines 11, 12 are all at the low level. In this state, the signal $\phi_j$ is turned to the low level at the time $T_7$ and the signal $\phi_i$ to the high level at the same time with the result that the data line 11 is held at the high level because the transistor $Q_{10}$ is turned on and the transistor $Q_2$ remains turned off. This causes the transistor $Q_4$ to be turned on and the data line 12 to be held at the low level without any change. Thus, the potentials of the data lines 11, 12 can be set to the high and low levels depending upon the data "0" to be written, respectively. The potential transition of the data lines 11, 12 is such as shown in FIG. 6(c), in which solid and dotted lines correspond to the data lines 11, 12, respectively, with its abscissa showing a time axis as in FIG. 5.

(4) For data "0" in the memory cell $M_{111}$ and external writing data "1"

The data line 11 is at the high level and the data line 12 at the low level after the reading of the data from the memory cell $M_{111}$. In this state, the signal din is turned to the high level and the signal $\overline{din}$ to the low level at the time $T_6$ in order to write "1" (low voltage) into the memory cell $M_{111}$. At this time, the data line 12 is held at the high level. The signal din is turned to the high level and the signal $\phi_j$ to the high level simultaneously. This causes the transistor $Q_{20}$ to be turned on and the data line 11 to be held at the low level with the result that the transistor $Q_4$ is turned off and no current flows through the data line 12. The transistor $Q_2$ is, on the other hand, turned on because the data line 12 is at the high level, and the data line 11 is thus held at the low level. At the time $T_7$, the signal $\phi_j$ is turned to the low level and the signal $\phi_i$ to the high level. This causes the transistor $Q_{10}$ to be turned on. At this time, the transistor $Q_2$ is on because the data line 12 is at the high level with the result that a current flows from the transistor $Q_{10}$ to the transistors $Q_2$, $Q_T$. The level of the data line 11 can be made sufficiently low because the conductances $g_m$'s of the transistors $Q_2$, $Q_T$ are selected to be much greater than the conductance $g_m$ of the transistor $Q_{10}$. Thus, the transistor $Q_4$ is off and the transistor $Q_2$ is on without any change.

As above, the levels of the data lines 11, 12 can be set to the low and high levels depending upon the data "1" to be written, respectively.

The potential transition of the data lines 11, 12 in the above operations is such as shown in FIG. 6(d), in which solid and dotted lines correspond to the data lines 11, 12, respectively, with its abscissa showing a time axis as in FIG. 5.

Incidentally, when the data are intended to be read from the memory cells in accordance with the present invention, it is effected by dropping the signal 301 on the way in the above writing operation at a time $T_6$ without applying signals $\phi_m$, din, $\overline{din}$ and $\phi_j$.

As mentioned above, the data can be written externally into the memory cell $M_{111}$. As has been seen from the description of the above operations, the transistor $Q_4$ is always off when the data line 12 receiving the external writing signals din, $\overline{din}$ is held the high level. Thus, no current flows through this line, which does not give rise to any problem that would appear in the conventional memory of FIG. 1.

The memory cell $M_{211}$ from which no data are needed to be written stores therein the same data as those which have been read. The potential of the data lines 21 depends upon the information read from the memory cell $M_{211}$ because the line 302 remains at the low level without any change due to the external writing signals din, $\overline{din}$. This means that the transistors $Q_{50}$, $Q_{60}$ and the flip-flop 42 carry out the same operations as those in which the same information as that read is written externally into the memory cell $M_{211}$. It is, therefore, understood that the operations of the transistors $Q_{50}$, $Q_{60}$ and the flip-flop 42 at the time of application of the signals $\phi_j$, $\phi_i$ as well as the level transition on the data lines 21, 22 are equal to the operations of the transistors $Q_{10}$, $Q_{20}$ and the flip-flop 41, and the level transition on the data lines 11, 21 which have already been described in the paragraph (1) or (2).

From the above description, it will be appreciated that the writing of data into the memory cell on data lines on the side of the transistors $Q_{W1}$, $Q_{W2}$ such as on the data lines 12, 22, 32 can be carried out in quite the same manner.

Thus, in the present embodiment, the operations of the transistors $Q_{10}$, $Q_{20}$, $Q_{50}$, $Q_{60}$ allows the external writing of data.

Figure 7:
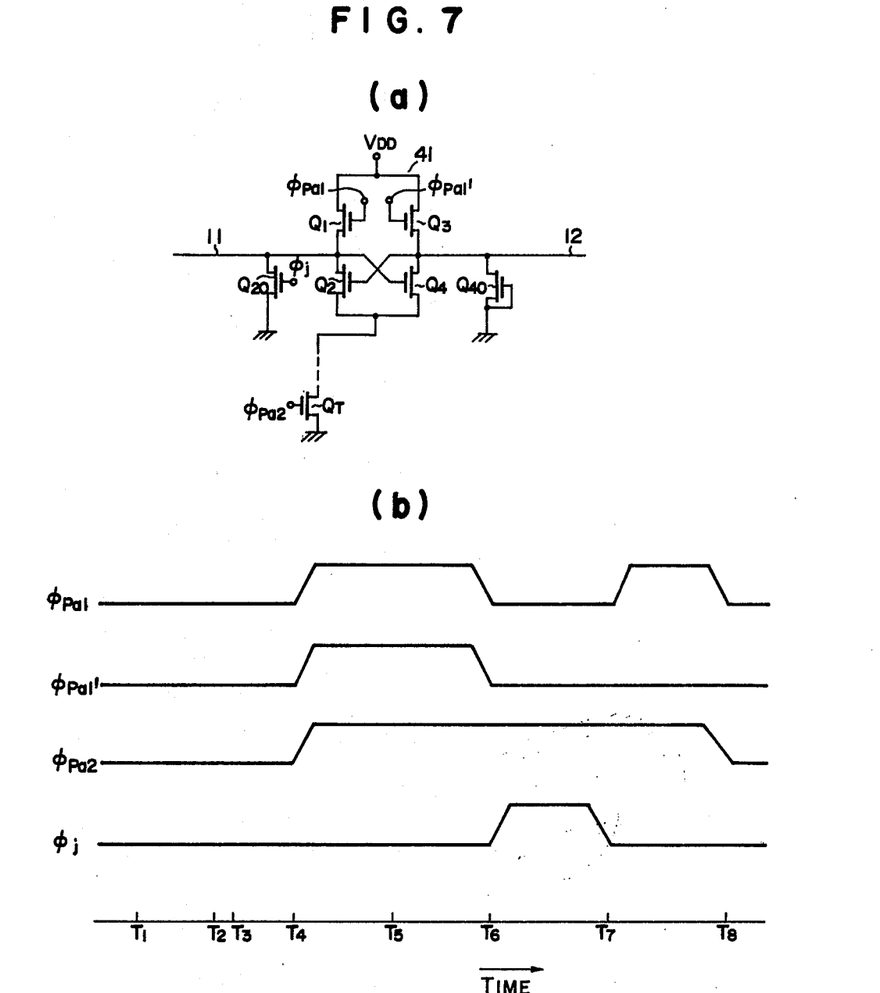

Another embodiment will next be described. In the embodiment of FIG. 4, the conductance $g_m$ of the transistor $Q_1$ is sufficiently small in comparison with that of the transistor $Q_2$. In the light of this fact, an embodiment has been proposed as shown in FIG. 7(a) in which transistors are reduced in number. In FIG. 7(a) there are shown the flip-flop 41 connected to the data lines 11, 12 as well as the switching transistor $Q_{20}$ and the unbalance adjusting transistor $Q_{40}$. This arrangement is different from that as shown in FIG. 4 in the fact that the former has no transistors $Q_{10}$, $Q_{30}$ and applies separate control signals $\phi_{pa1}$, $\phi_{pa1}'$ to the transistors $Q_1$, $Q_3$, respectively, but the other portions are the same as those in FIG. 4, so that they are removed from FIG. 7(a). The sense amplifier connected to the data lines 21, 22 is also arranged quite similarly to that of FIG. 7(a).

Control signals $\phi_{pa1}$, $\phi_{pa1}'$, $\phi_{pa2}$, $\phi_j$ in FIG. 7(a) are such as shown in FIG. 7(b) in which the other signals are not shown because they are the same as those in FIG. 5. The time axis is quite the same as that of FIG. 5. At a period $T_4$ to $T_6$, the signals $\phi_{pa1}$, $\phi_{pa1}'$, $\phi_{pa2}$ are at the high level and the signal $\phi_j$ at the low level, so that the circuit in FIG. 7(a) works in the same manner as in the circuit of FIG. 4 at a period $T_4$ to $T_6$ in FIG. 5 at which the signals $\phi_{pa1}$, $\phi_{pa2}$ are at the high level and the signal $\phi_j$ at the low level in FIG. 4. At a period $T_6$ to $T_7$ only the signals $\phi_{pa2}$, $\phi_j$ are at the high level, corresponding to the signals at the period $T_6$ to $T_7$ in FIG. 5.

Thus, the operation of the circuit in FIG. 7(a) at the period $T_6$ to $T_7$ is the same as that of the corresponding circuit in FIG. 4. At a period $T_7$ to $T_8$ only the signals $\phi_{pa1}$, $\phi_{pa2}$ are at the high level. This corresponds to the state of the signals $\phi_i$, $\phi_{pa2}$ at the period $T_7$ to $T_8$ in FIG. 5, so that the operation of the circuit in FIG. 7(a) at this period is the same as that of the corresponding circuit in FIG. 4.

From the above, it will be understood that the circuit in FIG. 7(a) operates quite the same as that in FIG. 4 under the control of the signals in the form of FIG. 7(b).

Figure 8:
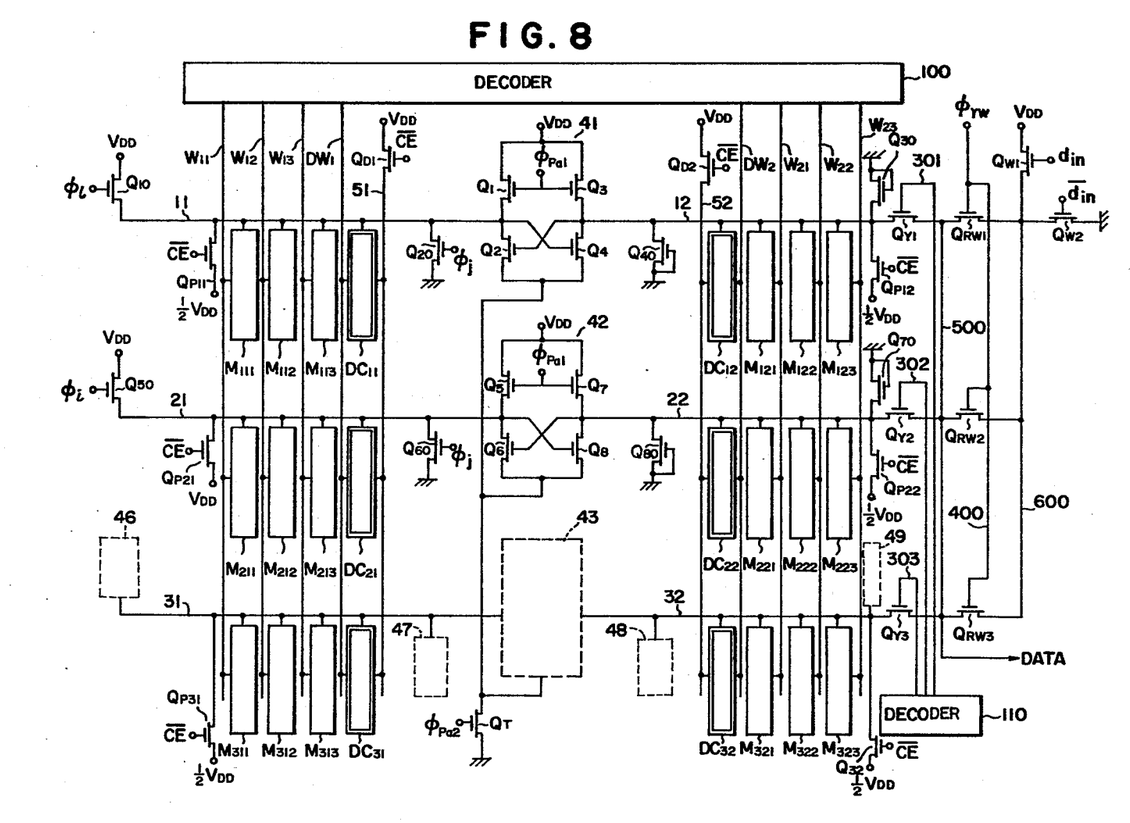
FIG. 8 is another arrangement of a memory according to the present invention.

FIG. 8 shows another embodiment of the present invention, in which the transistors $Q_{10}$, $Q_{50}$ in FIG. 4 are provided on the data lines 11, 21 at their end remote from the flip-flop 41, and the unbalance eliminating transistors $Q_{30}$, $Q_{40}$ are also provided on the data lines 12, 22 at their end remote therefrom. Blocks 46 to 49 in FIG. 8 shows circuits equivalent to those of the transistors $Q_{10}$, $Q_{20}$, $Q_{40}$, $Q_{30}$, respectively.

As will be apparent from the above arrangement, the operation of the circuit in FIG. 8 is quite the same as that of the circuit in FIG. 4. In the circuit of FIG. 8, however, the conductance $g_m$ of the transistors $Q_{10}$, $Q_{50}$ may be greater than that of the transistors $Q_{10}$, $Q_{50}$ in FIG. 4. In the circuit of FIG. 4, the conductance $g_m$ of the transistor $Q_{10}$ had to be sufficiently smaller than that of the transistors $Q_2$, $Q_T$, as has already described, in order to hold the data line 11 at a sufficiently low level when the transistors $Q_{10}$, $Q_2$ are all turned on as is the case with the previously mentioned operations (1), (4). In the circuit of FIG. 8, however, under the same conditions the level on the data line 11 depends upon the conductance $g_m$ of the transistor $Q_{10}$, the wiring resistance of the data line 11 and the conductances $g_m$'s of the transistors $Q_2$, $Q_T$. Thus, the greater the wiring resistance of the data line 11, the greater conductange $g_m$ of the transistor $Q_{10}$ can be allowed to obtain the same low level. As a result, the conductance $g_m$ of the transistor $Q_{10}$, $Q_{50}$ in FIG. 8 can be greater than that of the transistors $Q_{10}$, $Q_{50}$ in FIG. 4. This is advantageous in that the switching time of the transistors $Q_{10}$, $Q_{50}$ can be made shorter. It is to be noted that, also in FIG. 8, the transistors $Q_{10}$, $Q_{50}$ can be substituted for the transistors $Q_1$, $Q_5$ if they are desired to be omitted as shown in FIG. 7(a).

Figure 9:
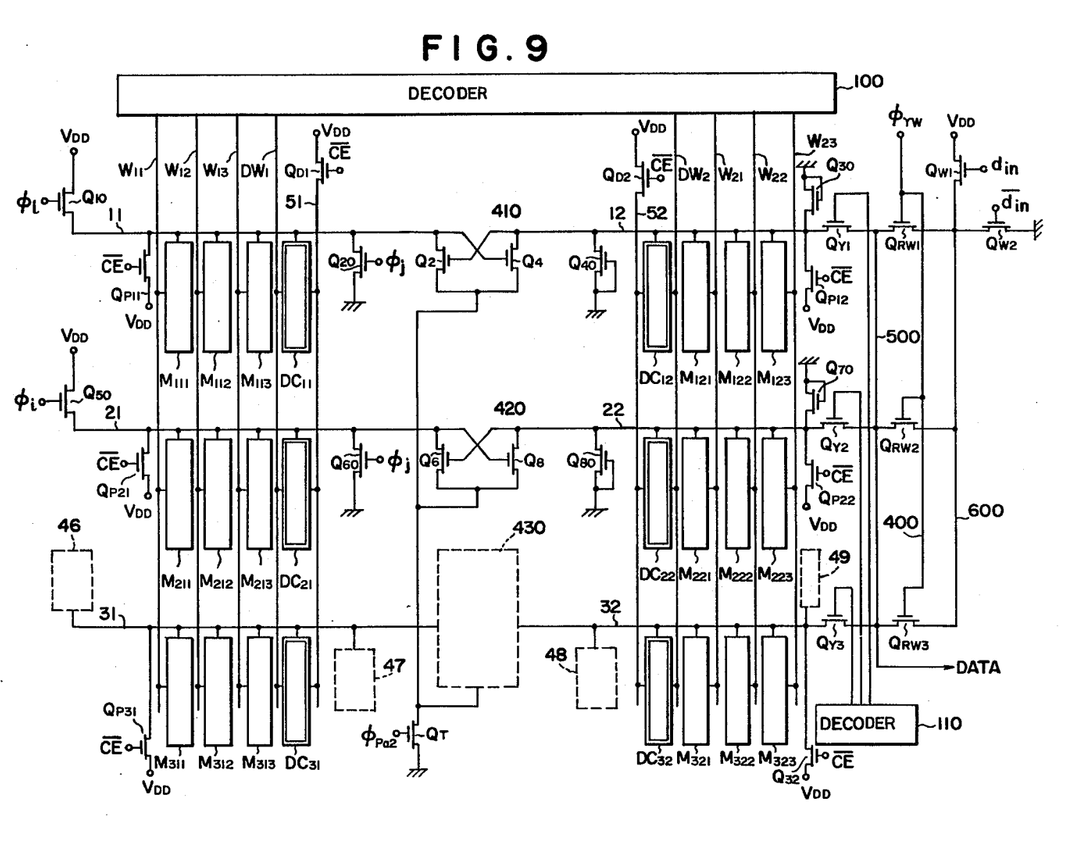
FIG. 9 is another arrangement of a memory according to the present invention.

FIG. 9 shows another embodiment of the present invention which employs flip-flops 410, 420, 430. These flip-flops correspond to the flip-flops 41, 42, 43 in FIG. 8 from which the transistors $Q_1$, $Q_3$, $Q_5$, $Q_7$ having their drain held at the high level $V_{DD}$ are removed. It is known that the flip-flop of this kind can be used as a sense amplifier for the memory. The flip-flop of this kind which is, for example, disclosed in "Institute of Electrical and Electronics Engineers Journal of Solid-State Circuits", Vol. SC-8, No. 5, Oct. 1973, pp. 310 – 318 is advantageous in that it has no power consumption due to the transistors $Q_1$, $Q_3$, $Q_5$, $Q_7$ as shown in FIG. 8. FIG. 9 is intended to show that the present invention is also applicable for use with such a sense amplifier.

The circuit arrangement of FIG. 9 further differs from that of FIG. 8 in that the transistors $Q_{P11}$, $Q_{P12}$, $Q_{P21}$, $Q_{P22}$, $Q_{P31}$, $Q_{P32}$ have their drain supplied with the high level $V_{DD}$ to raise the precharge level to the high level $V_{DD}$, and that a dummy information storing capacitor $C_D$ used for the dummy cell $DC_{11}$ and the like is made slightly greater than that in FIG. 8, more specifically, about half as great as the information storing capacity or $C_S$ for the memory cell $DC_{11}$ and the like.

Control signals used in the memory in FIG. 9 are all the same as those in FIG. 8 except for the control signal $\phi_{pa1}$ which is not required for the memory in FIG. 9.

The level on the data line after the reading of the memory cell is slightly different from that in FIG. 8. When, for example, the memory cell $M_{111}$ storing the information "0" (high voltage) receives the reading operation by means of the word line $W_{11}$, the level of the data line 11 drops from the precharge level (substantially $V_{DD}$) to a level slightly lower than it. For the information "1" (low voltage) which is stored in this memory cell $M_{111}$, the level of the data line 11 drops from the precharge level (substantially $V_{DD}$) to a much lower level. This means that the level of the data line 11 drops by a different amount depending upon the information "0" or "1" stored in the memory cell $M_{111}$. The selection of the dummy cell $DC_{12}$ at this time by means of the dummy word line $DW_2$ causes the level on the data line 12 to drop from the precharge level (substantially $V_{DD}$) to a level intermediate between the two different levels to which the level of the data line 11 drops depending upon the information "1" or "0" in the memory cell $M_{111}$, respectively.

The activation of the flip-flop 410 by the signal $\phi_{pa2}$ after that operation causes no change in level for one of the data lines 11, 12 which has the higher level, but causes a voltage drop to about 0 volt by the function of the flip-flop for the other data line having lower level.

Thus, the small level change on the data line 11 due to the information stored in the memory cell $M_{111}$ can be amplified and transmitted to the external in the form of DATA. Such a memory can receive the external writing operation of data without any error by using the transistors $Q_{10}$, $Q_{20}$, $Q_{50}$, $Q_{60}$, etc., when the data lines have the great wiring resistance. In FIG. 9, the transistors $Q_{10}$, $Q_{50}$, etc. can obviously be provided adjacent to the transistors $Q_{20}$, $Q_{60}$ as they can be in FIG. 4. Such an arrangement as shown in FIG. 9 allows the greater conductance $g_m$ of the transistors $Q_{10}$, $Q_{50}$ and a contribution to a high speed operation as is the case with that in FIG. 8.

In FIG. 9, all the transistors $Q_{10}$, $Q_{50}$, $Q_{P11}$, $Q_{P21}$ further have their drain held at the same level $V_{DD}$. This allows an arrangement in which the transistors $Q_{10}$ and $Q_{P11}$ as well as $Q_{P11}$ and $Q_{50}$ are made common with their gate receiving a signal $\phi_i + \overline{CE}$.

Another embodiment of the present invention will next be described.

In the previously described embodiments, the signals $\phi_i$, $\phi_j$ are simultaneously applied to the transistors $Q_{10}$, $Q_{50}$, etc., or the transistors $Q_{20}$, $Q_{60}$, etc., respectively. Such embodiments have the advantage that the signal lines on which the signals $\phi_i$, $\phi_j$ appear can be made common for the transistors $Q_{10}$, $Q_{50}$ or $Q_{20}$, $Q_{60}$ with the result of a small area required for the wiring and a simplified signal generator.

Figure 10:
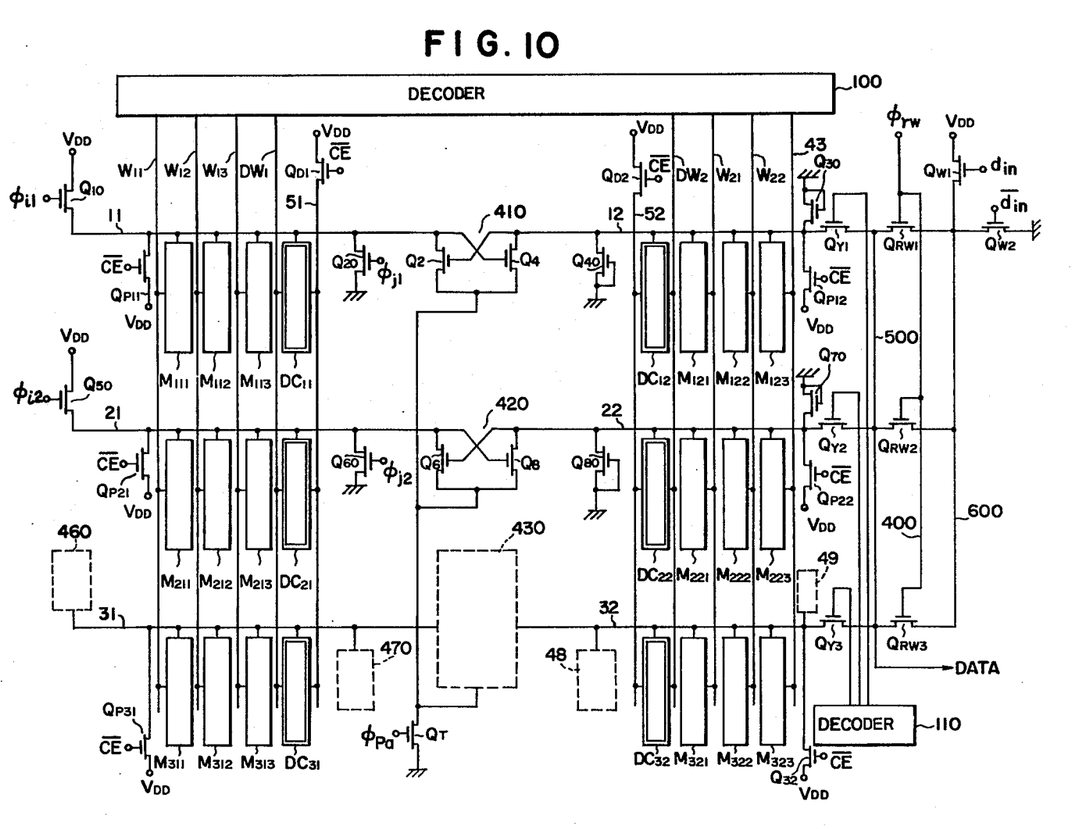
FIG. 10 is a arrangement of another embodiment of a memory according to the present invention.

The objects of the present invention can obviously be achieved by operating only the transistors $Q_{10}$, $Q_{20}$ connected to a memory cell (for example, $M_{111}$) in which data are written without operating the transistors ($Q_{50}$, $Q_{60}$) connected to a memory cell (for example, the memory cell $M_{211}$ when the memory cell $M_{111}$ receives the writing operation) in which no data are to be written. The reason is as follows: When the transistor $Q_6$ is on, a current flows through the transistors $Q_{50}$, $Q_6$ connected to a data line through which no data are to be written externally into the memory cell, for example, i.e., the data line 21 when the data are written into the memory cell $M_{111}$. This cause an increase in power consumption. Originally, however, the data line 21 after the reading of the memory cell holds a voltage which corresponds to information in the memory cell connected to the data line used in the reading operation. This means no need to operate the transistor $Q_{50}$. It is, therefore, effective that the signal $\phi_j$ is caused to be not applied to the transistor $Q_{50}$ connected to the data line 21 not used for the external writing of data in order to reduce the power consumption. The situation is nearly the same with the transistor $Q_{60}$. FIG. 10 shows an improvement of the arrangement in FIG. 9. The arrangement in FIG. 10 differs from that in FIG. 9 in that, in the former, separate control signals $\phi_{i1}$, $\phi_{i2}$ instead of the signal $\phi_i$ are used for the transistors $Q_{10}$, $Q_{50}$, and separate control signals $\phi_{j1}$, $\phi_{j2}$ instead of the signal $\phi_j$ are used for the transistors $Q_{20}$, $Q_{60}$.

Blocks 460, 470 are the same as the blocks 46, 47 in FIG. 9 with the exception that the signals $\phi_{i3}$, $\phi_{j3}$ (not shown) are applied independently from the signals $\phi_{i1}$, $\phi_{i2}$, and $\phi_{j1}$, $\phi_{j2}$ corresponding to other data lines. It is, however, to be noted that these signals $\phi_{j1}$, $\phi_{j2}$ are the same as the signal $\phi_j$ in FIG. 9 in view of the fact that they appear at the same timing and with the same voltage as the signal $\phi_j$ in FIG. 9. The difference is that the signals $\phi_{j1}$, $\phi_{j2}$ are respectively turned to the high voltage only when the data line 11 or 21 connected to the transistors $Q_{10}$, $Q_{50}$ to which the signals $\phi_{j1}$, $\phi_{j2}$ are applied is selected, when either the data line 11 or 12 is selected, or when either the data line 21 or 22 is selected.

Figure 11:
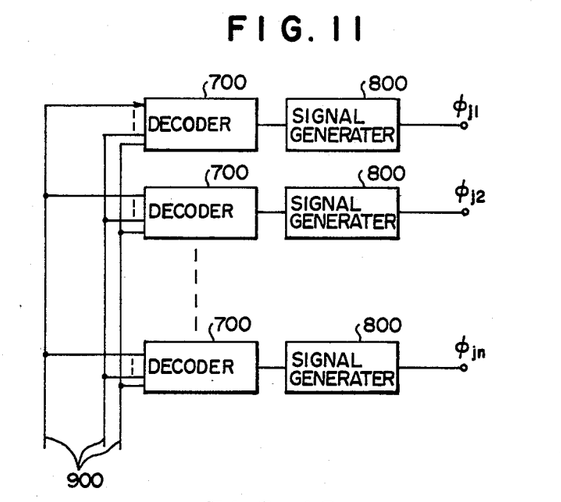
FIG. 11 is a block diagram showing one example of signal generators in the embodiment of FIG. 10.

Such control signals are generated from a circuit in FIG. 11, in which numeral 900 shows an address signal of a memory cell into which an information is to be written. The address signal 900 is decoded by a decoder 700 and drives a signal generator 800 to generate the signal $\phi_{j1}$ or any one of signals $\phi_{j2}, \ldots \phi_{jn}$. This applies quite the same for the signals $\phi_{i1}, \phi_{i2}, \ldots \phi_{in}$.

As mentioned above, the control signal is applied only to the required transistors to achieve a low power consumption. However, the separate application of such all signals $\phi_{j1}, \phi_{j2}, \ldots$ or $\phi_{i1}, \phi_{i2}, \ldots$, etc. increases the wiring and the signal generators for the signals $\phi_{j1}$, $\phi_{j2}$; $\phi_{i1}$, $\phi_{i2}$ in that degree. In order to reduce the power consumption without increasing the wiring too much, the data lines 11, 21, 31 . . . may be divided into a plurality of groups each of which includes transistors (for example, $Q_{10}$, $Q_{50}$, etc.) receiving the same control signal. In other words, all the control signals for the transistors (for example, $Q_{10}$, $Q_{50}$, etc.) connected to all the data lines in a group including a selected data line are turned to the high level.

Figure 12:
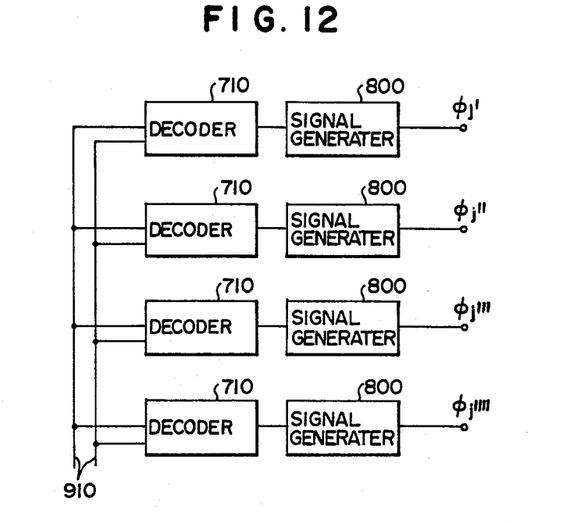
FIG. 12 is a block diagram showing another example of signal generators in the embodiment of FIG. 10.

FIG. 12 shows a circuit for this purpose in which the data lines are divided into four groups. The circuit includes two bits 910 of the most significant and the second most significant bits of the address signal, decoders 710 and signal generators 800 driven by the output from the decoder 710 for generating four signals $\phi_j'$, $\phi_j''$, $\phi_j'''$, $\phi_j''''$. The signal $\phi_j'$ is turned to the high level only at the time of selection of the data lines in the first group and supplied to all data lines in the same group in the form of the signal $\phi_j$ with the signals $\phi_j''$, $\phi_j'''$, $\phi_j''''$ held at the low level during this operation. Similarly, the signals $\phi_j''$, $\phi_j'''$, $\phi_j''''$ are supplied as the signal $\phi_j$ only at the time of selection of the data lines in the second, third and fourth groups to all the data lines in the corresponding groups, respectively.

As mentioned above, the present invention provides a memory including the sense amplifier of the flip-flop wherein the external writing operation of data can be performed normally in spite of the increased wiring resistance due to the micro-sized data lines.

What is claimed is:

1. In a memory comprising:
   (a) first and second data lines;
   (b) a plurality of word lines arranged so as to cross said first and second data lines;
   (c) first means for selectively applying a predetermined signal to one of said word lines;
   (d) memory cells provided at the intersections of said data lines and said word lines for storing therein a potential level on said data line at the time of selection of the corresponding word lines thereof;
   (e) second means for applying a first or second level to said second data line depending upon information "1" or "0" to be written; and
   (f) a flip-flop including at least first and second transistors with said first transistor having its output electrode connected to said first data line and its control electrode to said second data line, said second transistor having its control electrode connected to said first data line and its output electrode to said second data line, and said first and second transistors having their input electrodes coupled to each other, respectively.
   the improvement comprising:
   (g) first switching means connected to said first data line for applying a voltage to said first data line for turning off said second transistor connected to said first data line;
   (h) second switching means having its output electrode connected to said first data line, its input electrode to a power supply whose potential level is substantially equal to said first potential level and its control electrode supplied with an on-off control signal, the value of conductance of said second switching means between said input and output electrodes in its on-state being selected to be smaller than that of said first transistor in its conductive state;
   (j) means for controlling said first switching means so as to be operative during a predetermined time prior to the storing of information into said memory cells; and
   (k) means for applying a control signal making said second switching means low resisitive to said control electrode of said second switching means after the lapse of said predetermined time and in a state in which said predetermined potential is applied to said second data line with the aid of said second means.

2. A memory according to claim 1, wherein said first switching means is connected to said first data line in the neighbourhood of a connecting point between said first data line and said flip-flop, and said second switching means is connected to said first data line at a position remote from said connecting point.

3. A memory according to claim 1, wherein a capacitance balancing circuit having the same input capacitance as that of said first switching means as viewed from said first data line is provided on said second data line.

4. A memory according to claim 3, wherein said capacitance balancing circuit is switching means which has the same structure as said first switching means and which is held to be turned off.

5. A memory according to claim 1, wherein a capacitance balancing circuit having the same input capacitance as that of said second switching means as viewed from said second data line is provided on said second data line.

6. A memory according to claim 5, wherein said capacitance balancing circuit is switching means which has the same structure as said second switching means and which is held to be turned off.

7. A memory according to claim 1, wherein each of said first and second switching means and said first and second transistors comprises a field effect transistor.

8. A memory according to claim 1, wherein each of said memory cells comprises a field effect transistor.

9. A memory according to claim 8, wherein each of said memory cells comprises a field effect transistor having the gate connected to each of said word lines and its source to said data line, and a capacitive element connected at its one end to the drain of said field effect transistor and supplied at the other end with a predetermined voltage.

10. In a memory comprising:
(a) a plurality of data lines comprising a first group of data lines and a second group of data lines each pairing with each data line in said first group;
(b) a plurality of word lines comprising a first group of word lines crossing said first group of data lines and a second group of word lines crossing said second group of data lines;
(c) first means for applying a signal to one of said plurality of word lines to select said one word line;
(d) memory cells provided at the intersections of said first group of data lines and said first group of word lines and at the intersections of said second group of data lines and said second group of word lines, said memory cells being arranged to store therein a potential level on the corresponding data lines thereof when the corresponding word line is selected thereof;
(e) second means for selectively applying a first or second potential level to one of said second group of data lines depending upon an information to be written;
(f) flip-flops each provided on each pair of said data lines and including at least first and second transistors with said first transistor having its output electrode connected to one of said pair of data lines which belongs to said first group and its control electrode to one of said pair of data lines which belongs to said second group, said second transistor having its control electrode connected to one of said pair of data lines which belongs to said first group and its output electrode to one of said pair of data lines which belongs to said second group, and said first and second transistors having their input electrodes coupled to each other, respectively; and
(g) flip-flop driving voltage application means for applying a flip-flop driving voltage substantially equal to said second level potential to the input electrode of said first and second transistors in each flip-flop,
the improvement comprising:
(h) first switching means provided on each data line in said first group for applying to each data line in said first group a voltage turning off said second transistor in each said flip-flop connected to each data line therein;
(i) second switching means provided on each data line in said first group and having its output electrode connected to its corresponding data line in said first group, its input electrode connected to a power supply for supplying a potential substantially equal to said first potential level and its control electrode supplied with an on-off control signal, the value of conductance of said second switching means between said input and output electrodes in its on-state being selected to be smaller than that of said first transistor in each said flip-flop in its conductive state;
(j) means for controlling said first switching means so as to be operative during a predetermined time prior to the storing of information into said memory cell; and
(k) means for controlling said second switching means by applying to said second switching means a control signal making said second switching means low resistive after the lapse of said predetermined time and in a state in which said predetermined voltage is applied to one of data lines in said second group with the aid of said second means.

11. A memory according to claim 10, wherein said first switching means is connected to said first group of data lines in the neighbourhood of a connecting point between said first group of data lines and said flip-flops, and said second switching means is connected to said first group of data lines at a position remote from said connecting point.

12. A memory according to claim 10, wherein a capacitance balancing circuit having the same input capacitance as that of said first switching means as viewed from said first group of data lines is provided on said second group of data lines.

13. A memory according to claim 12, wherein said capacitance balancing circuit is switching means which has the same structure as said first switching means and which is held to be turned off.

14. A memory according to claim 10, wherein a capacitance balancing circuit having the same input capacitance as that of said second switching means as viewed from said second group of data lines is provided on said second group of data lines.

15. A memory according to claim 14, wherein said capacitance balancing circuit is switching means which has the same structure as said second switching means and which is held to be turned off.

16. A memory according to claim 10, wherein each of said first and second switching means and said first and second transistors comprises a field effect transistor.

17. A memory according to claim 10, wherein each of said memory cells comprises a field effect transistor.

18. A memory according to claim 17, wherein each of said memory cells comprises a field effect transistor having its gate connected to each of said word lines and its source to said data line and capacitive element connected at its one end to the drain of said field effect transistor and supplied at the other end with a predetermined voltage.

19. A memory according to claim 10, wherein there are provided a third transistor which constitutes said second switching means; a fourth transistor provided in each said flip-flop and having its output electrode connected to the control electrode of said first transistor in each said flip-flop and its input electrode connected to the input electrode of said third transistor; and means for applying to said second switching means a control signal for turning on said third and fourth transistors during a predetermined time during which an information is read from said memory cell.

20. A memory according to claim 10, wherein said means for controlling said first switching means is provided in common with all the pairs of data lines.

21. A memory according to claim 10, wherein said means for controlling said second switching means is provided in common with all the pairs of data lines.

22. A memory according to claim 10, wherein said means for controlling said first switching means is provided in common with groups each comprising a plurality of pairs of data lines, each controlling means being supplied with a part of memory cell selecting address signals to make operative all of said first switching means belonging to each group having any one of data lines that includes a memory cell into which an information is to be written.

23. A memory according to claim 10, wherein said means for controlling said second switching means is provided in common with groups each comprising a plurality of pairs of data lines, each controlling means being supplied with a part of memory cell selecting address signals to make operative all of said switching means belonging to each group having any one of data lines that includes a memory cell into which an information is to be written.

24. A memory according to claim 10, wherein said means for controlling said first switching means is provided in each pair of data lines, each controlling means being supplied with a memory cell selecting address signal to make said first switching means operative only when an information is to be written into a memory cell on the data line to which said controlling means is connected or on the data line pairing therewith.

25. A memory according to claim 10, wherein said means for controlling said second switching means is provided in each pair of data lines, each controlling means being supplied with a memory cell selecting address signal to make said second switching means operative only when information is to be written into a memory cell on the data line to which said controlling means is connected or on the data line pairing therewith.

* * * * *